(12) United States Patent
Aptaker et al.

(10) Patent No.: US 9,589,762 B2
(45) Date of Patent: Mar. 7, 2017

(54) DEFLECTION PLATE AND DEFLECTION DEVICE FOR DEFLECTING CHARGED PARTICLES

(75) Inventors: Peter Simon Aptaker, Oxfordshire (GB); Paul Beasley, Oxfordshire (GB); Oliver Heid, Erlangen (DE)

(73) Assignee: SIEMENS AKTIENGESELLSCHAFT (DE)

(*) Notice: Subject to any disclaimer, the term of this patent is extended or adjusted under 35 U.S.C. 154(b) by 0 days.

(21) Appl. No.: 14/402,352

(22) PCT Filed: Jun. 1, 2012

(86) PCT No.: PCT/EP2012/060348
§ 371 (c)(1),
(2), (4) Date: Feb. 5, 2015

(87) PCT Pub. No.: WO2013/178282
PCT Pub. Date: Dec. 5, 2013

(65) Prior Publication Data
US 2015/0170871 A1    Jun. 18, 2015

(51) Int. Cl.
*G21K 5/04*      (2006.01)
*H01J 37/147*    (2006.01)
*G21K 1/087*     (2006.01)
*H05H 7/00*      (2006.01)
*H05H 9/00*      (2006.01)

(52) U.S. Cl.
CPC ............ *H01J 37/147* (2013.01); *G21K 1/087* (2013.01); *H05H 7/00* (2013.01); *H05H 9/00* (2013.01); *H01J 2235/166* (2013.01); *H01J 2237/15* (2013.01); *H05H 2007/002* (2013.01)

(58) Field of Classification Search
USPC ............ 250/396 R, 397, 492.1, 492.2, 492.3
See application file for complete search history.

(56) References Cited

U.S. PATENT DOCUMENTS

| | | |
|---|---|---|
| 3,558,879 A | 1/1971 | Larson et al. |
| 4,126,781 A | 11/1978 | Siegel |
| 4,219,730 A | 8/1980 | Ishikawa et al. |
| 4,434,371 A | 2/1984 | Knauer |
| 5,382,883 A | 1/1995 | Chen et al. |
| 5,849,436 A * | 12/1998 | Yamada ............... B82Y 10/00 250/492.2 |
| 6,653,645 B1 | 11/2003 | Chen |
| 2004/0099811 A1* | 5/2004 | Choi et al. ............ 250/396 R |

(Continued)

FOREIGN PATENT DOCUMENTS

| | | |
|---|---|---|
| CN | 1452014 A | 10/2003 |
| CN | 1589049 A | 3/2005 |

(Continued)

OTHER PUBLICATIONS

International Search Report for PCT Application No. PCT/EP2012/060348, International Filing Date: Jun. 1, 2012; 2 pgs.

(Continued)

*Primary Examiner* — Nicole Ippolito
(74) *Attorney, Agent, or Firm* — Schmeiser Olsen & Watts LLP

(57) ABSTRACT

A deflection plate for deflecting charged particles, the plate comprising a recess is provided.

14 Claims, 3 Drawing Sheets

(56) References Cited

U.S. PATENT DOCUMENTS

2011/0286319 A1* 11/2011 Kamikubo ............. B82Y 10/00
                                                      369/101
2012/0205537 A1*  8/2012 Jiang ..................... H01J 37/147
                                                      250/307
2013/0149646 A1*  6/2013 Touya et al. .................. 430/296

FOREIGN PATENT DOCUMENTS

| CN | 101248505 A | 8/2008 |
| CN | 101933117 A | 12/2010 |
| JP | H06267454 A | 9/1994 |
| JP | H08222168 A | 8/1996 |
| SU | 980190 A1 | 12/1982 |

OTHER PUBLICATIONS

Chinese Office Action issued Dec. 22, 2015; Application No. 201280073623.0; 11 pgs.

* cited by examiner

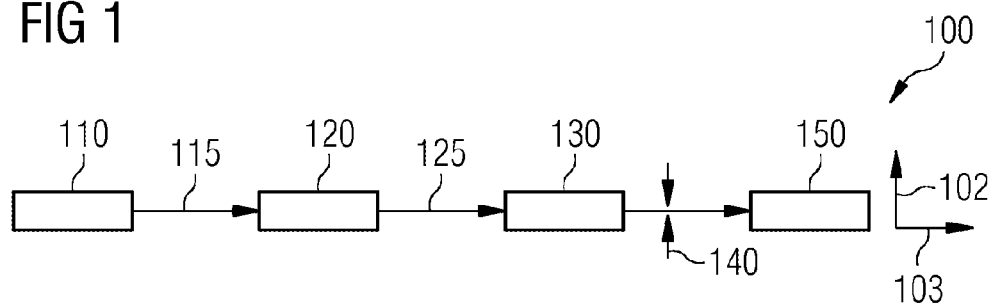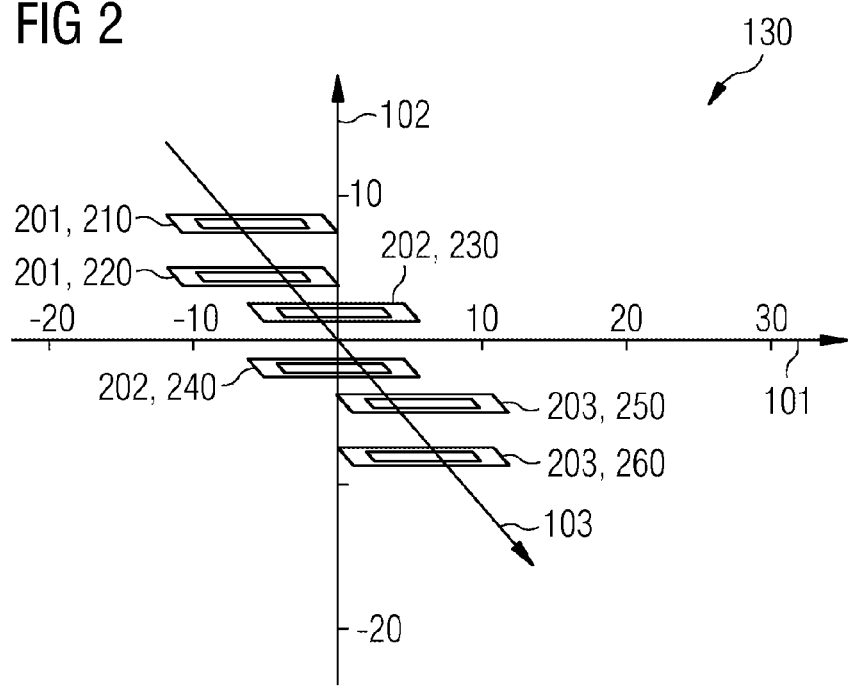

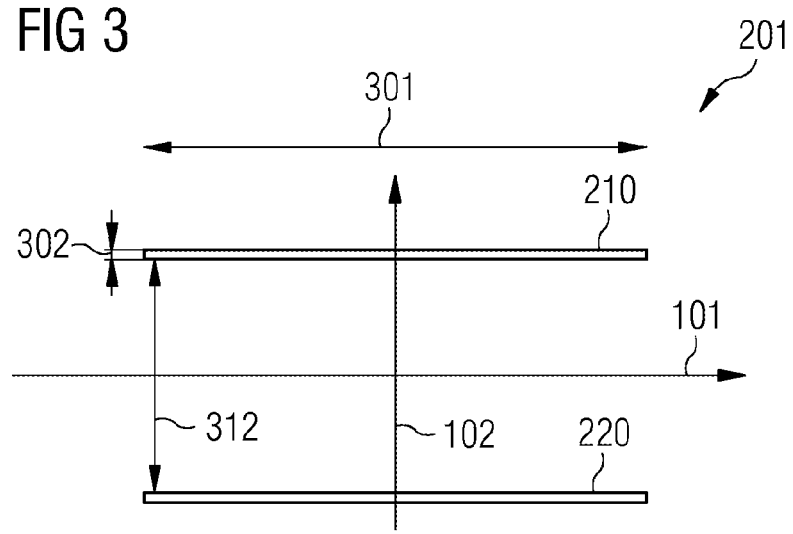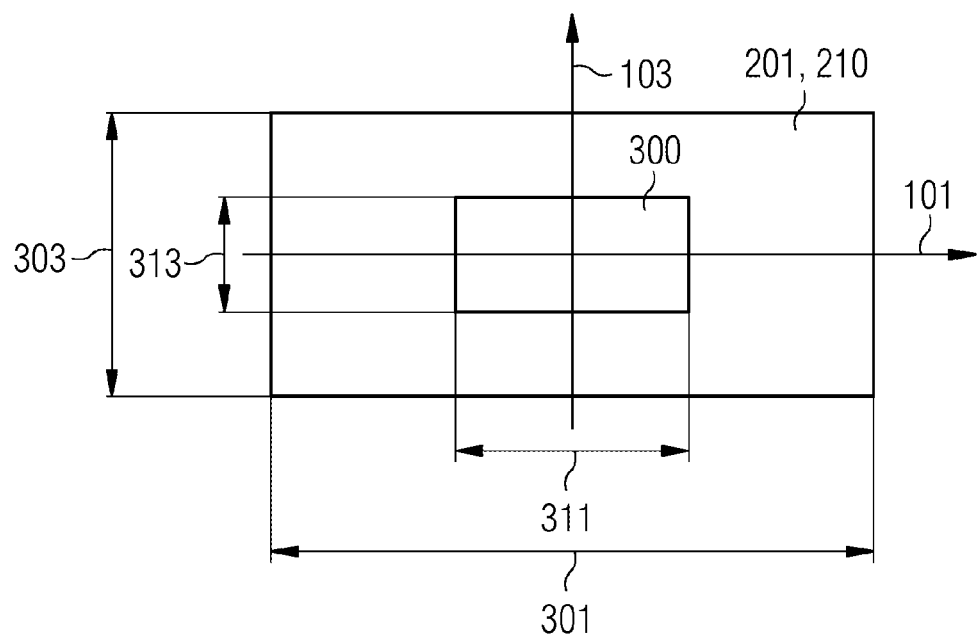

DEFLECTION PLATE AND DEFLECTION DEVICE FOR DEFLECTING CHARGED PARTICLES

CROSS-REFERENCE TO RELATED APPLICATION

This application claims priority to PCT Application No. PCT/EP2012/060348, having a filing date of Jun. 1, 2012, the entire contents of which is hereby incorporated by reference.

FIELD OF TECHNOLOGY

The following relates to a deflection plate for deflecting charged particles, and a deflection device for deflecting charged particles.

BACKGROUND

The deflection of moving charged particles by electric and/or magnetic fields is known. The generation of electric fields by applying electric voltages to conductive plates is also known.

SUMMARY

An aspect relates to an improved deflection plate for deflecting charged particles. A further aspect relates to providing an improved deflection device for deflecting charged particles.

A deflection plate according to embodiments of the invention for deflecting charged particles has a recess. Advantageously, compared to a deflection plate without a recess, this deflection plate generates an electric field with an improved spatial profile.

In a preferred embodiment of the deflection plate, the latter is embodied as a substantially flat plate. Advantageously, the deflection plate can in that case be easily and cost-effectively manufactured. In particular, the deflection plate can be advantageously manufactured as a circuit board, for example a printed circuit board.

In one embodiment of the deflection plate, the recess is embodied as a hole. This advantageously weakens an electric field, generated by the deflection plate, in the region of the hole.

In another embodiment of the deflection plate, the recess is embodied as a slot. Advantageously, this embodiment of the recess also results in a weakening of an electric field, generated by the deflection plate, in the region of the recess. Expediently, the recess is arranged centrally in the deflection plate. In that case, a spatial profile of an electric field, generated by the deflection plate, advantageously has a flatter profile.

In an expedient embodiment of the deflection plate, the latter comprises a conductive material, more particularly a metal. Advantageously, the deflection plate can then be charged to an electric potential.

A deflection device according to embodiments of the invention for deflecting charged particles comprises a first deflection plate of the aforementioned type. Advantageously, this deflection device can be used for deflecting charged particles of a particle beam. As a result of the advantageously embodied deflection plate, the deflection device can be used for selective deflection of individual particle bunches from a beam of successive bunches of charged particles.

In a preferred embodiment of the deflection device, the latter comprises a second deflection plate of the aforementioned type. Advantageously, a potential difference then can be generated between the deflection plates of the deflection device.

In a particularly preferred embodiment of the deflection device, the deflection plates are embodied as substantially flat plates. Here, the first deflection plate and the second deflection plate are oriented perpendicular to a second spatial direction. Moreover, the first deflection plate and the second deflection plate are spaced apart in the second spatial direction. Advantageously, in the case of this deflection device, a component of an electric field pointing in the second spatial direction extends in an approximately rectangular manner in a spatial direction perpendicular to the second spatial direction.

In a development of the deflection device, the latter comprises a third deflection plate and a fourth deflection plate. Here, the third deflection plate is displaced in relation to the first deflection plate in a third spatial direction perpendicular to the second spatial direction. Moreover, the fourth deflection plate is displaced in relation to the second deflection plate in the third spatial direction. Advantageously, a different potential difference can be applied between the third deflection plate and the fourth deflection plate than between the first deflection plate and the second deflection plate.

In a preferred embodiment of the deflection device, the latter is embodied to deflect a charged particle moving in the third spatial direction into the second spatial direction. Advantageously, the deflection device can then be used to selectively deflect individual particles or bunches of particles from a particle beam.

BRIEF DESCRIPTION

Some of the embodiments will be described in detail, with reference to the following figures, wherein like designations denote like members, wherein:

FIG. 1 shows a schematic illustration of a particle therapy instrument;

FIG. 2 shows a schematic illustration of an embodiment of a deflection device;

FIG. 3 show a first section through an embodiment of a plate pair of the deflection device;

FIG. 4 shows a top view of an embodiment of the plate pair of the deflection device;

DETAILED DESCRIPTION

Figure 5:
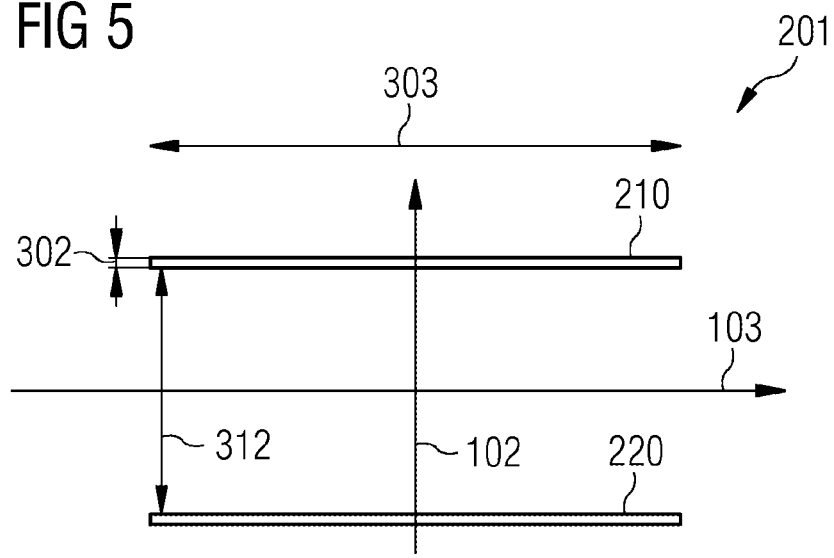
FIG. 5 shows a second section through an embodiment of the plate pair of the deflection device.

FIG. 1 shows, in a very schematic illustration, a particle therapy instrument 100 as an exemplary application for a deflection device. However, deflection devices can also be used in a multiplicity of other fields of application. The present invention is by no means restricted to the field of particle therapy instruments.

The particle therapy instrument 100 can be used for performing particle therapy, in which a diseased body part of a patient is bombarded with charged particles. By way of example, the charged particles can be protons. By way of example, the disease of the patient can be a tumor.

The particle therapy instrument 100 comprises an ion source 110, a bunching device 120, a deflection device 130, a stop 140 and a particle accelerator 150, which are disposed in succession in a z-direction 103.

The ion source 110 serves for generating a beam 115 of charged particles. By way of example, the particles of the particle beam 115 can be protons. The particles of the particle beam 115 leave the ion source 110 in the z-direction 103. By way of example, when leaving the ion source 110, the particles of the particle beam 115 can have an energy of 10 keV to 20 keV.

The bunching device 120 serves for subdividing the continuous particle beam 115 into discrete particle bunches 125. The particle bunches 125 leave the bunching device 120 in the z-direction 103. The bunching device 120 can also be dispensed with.

The deflection device 130 serves to selectively deflect individual particle bunches 125 (or individual particles from the continuous particle beam 115) in relation to the movement thereof extending in the z-direction 103 in a y-direction 102 perpendicular to the z-direction 103.

Particles and particle bunches 125 deflected by the deflection device 130 do not, or do not completely, pass the stop 140 which follows the deflection device 130, while the non-deflected particles and particle bunches 125 pass the stop 140. In alternative embodiments of the particle therapy instrument 100, only particles and particle bunches 125 deflected in the y-direction 102 by the deflection device 130 completely pass the stop 140.

Particles and particle bunches 125, which pass the stop 140, reach the particle accelerator 150, where they are accelerated to a higher kinetic energy of e.g. 80 MeV to 250 MeV. By way of example, the particle accelerator 150 can be a linear accelerator. In particular, the particle accelerator 150 can be an RF linear accelerator.

FIG. 2 shows a schematic illustration of the deflection device 130. In the embodiment shown in FIG. 2, the deflection device 130 comprises six deflection plates for deflecting the particle bunches 125 of charged particles. In detail, the deflection device 130 in the shown embodiment comprises a first deflection plate 210, a second deflection plate 220, a third deflection plate 230, a fourth deflection plate 240, a fifth deflection plate 250 and a sixth deflection plate 260.

The first deflection plate 210 and the second deflection plate 220 form a first plate pair 201. The third deflection plate 230 and the fourth deflection plate 240 form a second plate pair 202. The fifth deflection plate 250 and the sixth deflection plate 260 form a third plate pair 203. In another embodiment, the deflection plate 230 may also comprise fewer than three plate pairs 201, 202, 203 or more than three plate pairs 201, 202, 203.

The plate pairs 201, 202, 203 are disposed in succession in the z-direction 103. The two respective deflection plates of each plate pair 201, 202, 203 are situated at a respectively common position in the z-direction 103 and in an x-direction 102 perpendicular to the y-direction 102 and to the z-direction 103, and are spaced apart in the y-direction 102. The particle bunches 125 pass between the two respective deflection plates of the plate pair 201, 202, 203 in the z-direction 103.

The deflection plates 210, 220, 230, 240, 250, 260 comprise an electrically conductive material, preferably a metal. The deflection plates 210, 220, 230, 240, 250, 260 can be embodied for example as circuit boards with a metallic coating.

An electric potential difference, and hence an electric field, can respectively be generated between the deflection plates of the plate pairs 201, 202, 203 in order to deflect the particles of the particle bunches 125 moving in the z-direction 103 in the y-direction 102. By way of example, a positive voltage could be applied to the first deflection plate 210 of the first plate pair 201 and a negative voltage with the same magnitude could be applied to the second deflection plate 220 of the first plate pair 201. The potential differences generated in the various plate pairs 201, 202, 203 can differ from one another. In order only to deflect individual particle bunches 125 of the particle bunches 125 following one another in quick time succession into the y-direction 102, it is necessary to apply short-term voltage pulses to the deflection plates 210, 220, 230, 240, 250, 260.

A component pointing in the y-direction 102 of an electric field generated in a plate pair 201, 202, 203 has a Gaussian profile in the z-direction 103 if the deflection plates 210, 220, 230, 240, 250, 260 are embodied as closed plane plates. However, it is more expedient if the profile of the component of the electric field pointing in the y-direction 102 has an approximate rectangle function in the z-direction 103 within a plate pair 201, 202, 203.

In order to approximate this preferred spatial profile of the component of the electric field pointing in the y-direction 102, the deflection plates 210, 220, 230, 240, 250, 260 of the deflection device 130 in each case have a recess. This will be explained below on the basis of FIGS. 3 to 5, which show representations of the first plate pair 201. The remaining plate pairs 202, 203 preferably have an identical design to that of the first plate pair 201.

FIG. 3 shows a first section through the first plate pair 201. Here, the first section extends perpendicular to the z-direction 103. The first deflection plate 210 and the second deflection plate 220 of the first plate pair 201 have a width 301 in the x-direction 101. By way of example, the width 301 can be 4 mm. The deflection plates 210, 220 respectively have a thickness 302 in the y-direction 102. By way of example, the thickness 302 can be 0.1 mm. In the y-direction 102, the first deflection plate 210 and the second deflection plate 220 have a distance 312 from one another. By way of example, the distance 312 can be 6 mm.

FIG. 4 shows a top view of the first deflection plate 210 of the first plate pair 201 in a viewing direction opposing the y-direction 102. The second deflection plate 220 (not visible in FIG. 4) is preferably identical to the first deflection plate 210. The first deflection plate 210 has a length 303 in the z-direction 103, which may be e.g. 4 mm.

The first deflection plate 210 also has a rectangular hole 300. The hole 300 is arranged centrally in the first deflection plate 210. In the x-direction 101, the hole 300 has a hole width 311 which can be 1 mm, for example. In the z-direction 103, the hole 300 has a hole length 313 which can for example likewise be 1 mm.

If the first deflection plate 210 is embodied as a circuit board having a metallic coating, it suffices for the hole 300 to be formed in the metallic coating.

Instead of the centrally arranged hole 300, the first deflection plate 210 could also have a hole which is not arranged centrally.

Instead of the hole 300, the first deflection plate 210 could also have a through-slot which divides the first deflection plate 210 into two parts. The slot can be oriented, for example, in the x-direction 101 or in the z-direction 103. If the first deflection plate 210 is embodied as a circuit board having a metallic coating, it suffices for the slot to be formed in the metallic coating. The two portions of the split deflection plate 210 can in that case be arranged on a common circuit board.

FIG. 5 shows a second section through the deflection plate 210, 220 of the first plate pair 201. In FIG. 5, the section is perpendicular to the x-direction 101.

Figure 6:
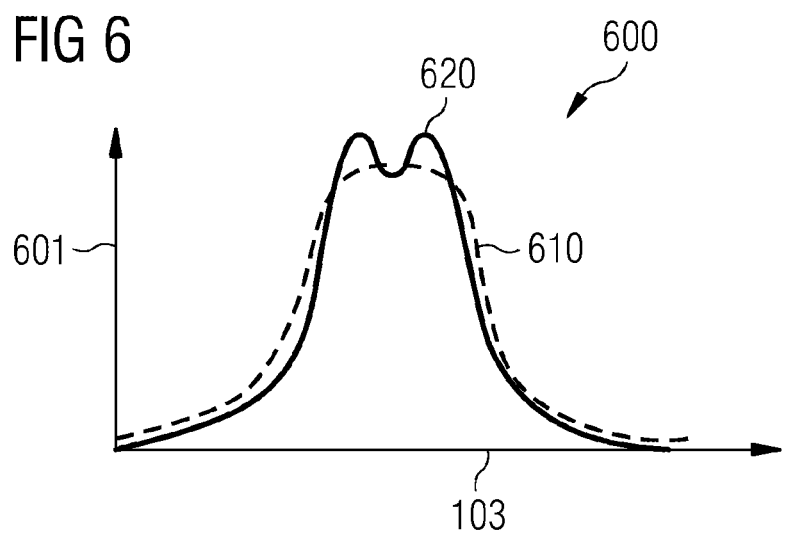
FIG. 6 shows a graph of a field strength profile within the plate pair.

FIG. 6 shows, in a graph 600, a spatial field strength profile which emerges within the plate pairs 201, 202, 203. The z-direction 103 in the region of a plate pair 201, 202, 203 is plotted on a horizontal axis of the graph 600. A component 601 of an electric field strength pointing in the y-direction 102 is plotted on a vertical axis of the graph 600.

A first field profile 610 specifies the profile of the electric field strength in the y-direction 102 in the center between the upper and the lower deflection plate of the plate pair 201, 202, 203. What can be identified is that the first field profile 610 more closely approximates a rectangular function as compared to a Gaussian profile. This approximation to the rectangular function is achieved by the holes 300 provided in the deflection plates 210, 220, 230, 240, 250, 260.

A second field profile 620 indicates the profile of the electric field strength in the y-direction 102 at a position which is closer to one deflection plate than to the other deflection plate of the plate pair 201, 202, 203 in the y-direction 102. What can be identified is that the second field profile 620 has a convex embodiment in the z-direction 103 in the center of the plate pair 201, 202, 203.

Although the invention was illustrated and described in detail by the preferred exemplary embodiments, the invention is not restricted by the disclosed examples. Other variations can be derived therefrom by a person skilled in the art, without departing from the scope of protection of the invention.

The invention claimed is:

1. A deflection plate for deflecting charged particles,
wherein the deflection plate has a recess within the deflection plate,
further wherein the recess is a rectangular recess fully enclosed by the deflection plate.

2. The deflection plate as claimed in claim 1, wherein the deflection plate is a substantially flat plate.

3. The deflection plate as claimed in claim 1, wherein the recess is a hole.

4. The deflection plate as claimed in claim 1, wherein the recess is a slot.

5. The deflection plate as claimed in claim 1, wherein the recess is arranged centrally in the deflection plate.

6. The deflection plate as claimed in claim 1, wherein the deflection plate comprises a conductive material, the conductive material being a metal.

7. The deflection device for deflecting charged particles, wherein the deflection device comprises a first deflection plate as claimed in claim 1.

8. A deflection device as claimed in claim 7, wherein the deflection device comprises a second deflection plate.

9. The deflection device as claimed in claim 8, wherein the first deflection plate and the second deflection plate are, wherein the first deflection plate and the second deflection plate are oriented perpendicular to a second spatial direction, wherein the first deflection plate and the second deflection plate are spaced apart in the second spatial direction.

10. The deflection device as claimed in claim 9, wherein the deflection device comprises a third deflection plate and a fourth deflection plate, wherein the third deflection plate is displaced in relation to the first deflection plate in a third spatial direction perpendicular to the second spatial direction, wherein the fourth deflection plate is displaced in relation to the second deflection plate in the third spatial direction.

11. The deflection device as claimed in claim 10, wherein the deflection device is configured to deflect a charged particle moving in the third spatial direction into the second spatial direction.

12. The deflection plate as claimed in claim 1, wherein the deflection plate is a circuit board having a metallic coating, and the recess is formed only in the metallic coating.

13. A deflection plate for deflecting charged particles,
wherein the deflection plate has a recessed portion, and the recessed portion is rectangular.

14. A deflection plate for deflecting charged particles,
wherein the deflection plate has a recess within the deflection plate, the deflection plate is a circuit board having a metallic coating, and the recess is formed only in the metallic coating.

* * * * *